US012755765B2

(12) United States Patent
Hung et al.

(10) Patent No.: US 12,755,765 B2
(45) Date of Patent: Oct. 6, 2026

(54) 3D NOR FLASH BASED IN-MEMORY COMPUTING

(71) Applicant: MACRONIX INTERNATIONAL CO., LTD., Hsinchu (TW)

(72) Inventors: Chun-Hsiung Hung, Hsinchu (TW); Ken-Hui Chen, Hsinchu (TW); Shang-Chi Yang, Changhua (TW); Tung-Yu Li, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 252 days.

(21) Appl. No.: 18/109,455

(22) Filed: Feb. 14, 2023

(65) Prior Publication Data

US 2024/0274170 A1 Aug. 15, 2024

(51) Int. Cl.

*G11C 7/12* (2006.01)
*G06F 7/544* (2006.01)
*G11C 8/08* (2006.01)

(52) U.S. Cl.

CPC .............. *G11C 7/12* (2013.01); *G06F 7/5443* (2013.01); *G11C 8/08* (2013.01)

(58) Field of Classification Search

CPC ............ G11C 7/12; G11C 8/08; G06F 7/5443
USPC ..................................................... 365/185.13
See application file for complete search history.

(56) References Cited

U.S. PATENT DOCUMENTS 5,986,937 A * 11/1999 Yero ........................ G11C 7/12 365/205
7,057,939 B2 6/2006 Li et al.
7,701,774 B2 * 4/2010 Spitz ...................... G11C 16/30 365/185.21
8,891,293 B2 11/2014 Du et al.
9,099,181 B2 8/2015 Ong
9,646,692 B1 5/2017 Lung et al.
10,635,398 B2 4/2020 Lin et al.
10,741,242 B2 8/2020 Seo et al.
10,777,566 B2 9/2020 Lue
10,957,392 B2 3/2021 Lee et al.
(Continued)

FOREIGN PATENT DOCUMENTS

CN 104051023 A 9/2014
EP 2057633 B1 3/2013
(Continued)

*Primary Examiner* — Donald HB Braswell
(74) *Attorney, Agent, or Firm* — Andrew L. Dunlap; Haynes Beffel & Wolfeld LLP

(57) ABSTRACT

Compute-in-memory CIM operations using signed bits produce signed outputs. A circuit for CIM operations comprises an array of memory cells arranged in columns and rows, memory cells in columns connected to corresponding bit lines, and memory cells in rows connected to corresponding word lines. The array is programmable to store signed weights in sets of memory cells, the sets being operatively coupled with a corresponding pair of bit lines and a corresponding pair of word lines. Word line drivers are configured to drive true and complement voltages representing signed inputs on respective word lines in selected pairs of word lines. Sensing circuits are configured to sense differences between first and second currents on respective bit lines in selected pairs of bit lines and to produce signed outputs for the selected pairs of bit lines as a function of the difference.

19 Claims, 7 Drawing Sheets

(56) References Cited

U.S. PATENT DOCUMENTS

| | | | | |
|---|---|---|---|---|
| 11,127,460 | B2 * | 9/2021 | Asnaashari | G11C 29/42 |
| 11,132,176 | B2 * | 9/2021 | Hung | G11C 16/0416 |
| 11,138,497 | B2 | 10/2021 | Lin et al. | |
| 11,309,026 | B2 * | 4/2022 | Kang | G06N 3/063 |
| 11,315,009 | B2 * | 4/2022 | Buchanan | G11C 13/0069 |
| 12,260,130 | B2 * | 3/2025 | Lue | G11C 7/18 |
| 2003/0090934 | A1 | 5/2003 | Iwata | |
| 2008/0031043 | A1 | 2/2008 | Aochi et al. | |
| 2019/0348097 | A1 | 11/2019 | Karmakar et al. | |
| 2023/0326499 | A1 * | 10/2023 | Pasotti | G11C 13/004<br>365/191 |

FOREIGN PATENT DOCUMENTS

| | | | |
|---|---|---|---|
| TW | 253057 | B | 8/1995 |
| TW | 200620284 | A | 6/2006 |
| TW | 201212026 | A | 3/2012 |
| TW | 201301286 | A | 1/2013 |
| TW | 1457923 | B | 10/2014 |
| TW | 201735037 | A | 10/2017 |
| TW | 201933361 | A | 8/2019 |
| TW | I764104 | B | 5/2022 |

* cited by examiner

3D NOR FLASH BASED IN-MEMORY COMPUTING

BACKGROUND

Field

A disclosure is presented that relates to circuitry usable to perform in-memory computation, such as multiply-and-accumulate or other sum-of-products like operations.

Description of Related Art

In neuromorphic computing systems, machine learning systems and circuitry used for some types of computations based on linear algebra, the multiply-and-accumulate or sum-of-products functions can be important components. Such functions can be expressed as follows:

$$f(X_i) = \sum_{i=1}^{M} W_i X_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function. One problem associated with large computations of this type arises because of the complexity of the data flow among memory locations used in the computations which can involve large tensors of input variables and large numbers of weights.

It is desirable to provide structures for sum-of-products operations suitable for implementation in-memory, to reduce the number of data movement operations required.

SUMMARY

A circuit is described supporting compute-in-memory CIM operations using signed bits. The circuit comprises an array of memory cells arranged in columns and rows, memory cells in columns connected to corresponding bit lines, and memory cells in rows connected to corresponding word lines. Sensing circuits are configured to sense differences between first and second currents on respective bit lines in selected pairs of bit lines and to produce outputs for the selected pairs of bit line as a function of the difference. The array is programmable to store signed weights in sets of memory cells, the sets being operatively coupled with a corresponding pair of bit lines and a corresponding pair of word lines. Word line drivers can be configured to drive voltages representing signed inputs on respective word lines in selected pairs of word lines. The outputs produced by the sensing circuits can be signed outputs.

A configuration of memory cells is described for storing a signed bit, usable as a coefficient in a CIM operation. The configuration includes a set of memory cells, the set including first and second memory cells connected to a first word line in a corresponding pair of word lines, and third and fourth memory cells connected to a second word line in the corresponding pair of word lines. The first and third memory cells are on the first bit in a corresponding pair of bit lines and the second and fourth memory cells are on a second bit line in the corresponding pair of bit lines.

Sensing circuits are described which include a sensing module connectable to a pair of bit lines. The sensing module includes a current mirror circuit having a first leg and a second leg operatively connectable to first and second bit lines in the pair of bit lines, and an adjustable reference current source, and responsive to control signals to set a first configuration to adjust current on the first leg using the adjustable reference current source, and to set a second configuration to adjust current on the second leg using the adjustable reference current source. A comparator is included to compare a voltage on the first leg to a voltage on the second leg.

The array of memory cells can be a NOR or AND architecture flash memory array. Other embodiments can use an array in a NAND architecture flash memory. The memory cells in the array of memory cells can be charge trapping memory cells.

A method for storing a signed bit in a memory array including word lines and bit lines is described. The method includes writing respective threshold levels VT1, VT2, VT3 and VT4 in first, second, third and fourth memory cells, wherein the first memory cell is on a first bit line and a first word line, the second memory cell is on a second bit line and the first word line, the third memory cell is on the first bit line and a second word line, and the fourth memory cell is on the second bit line and the second word line; including for a signed bit of −1, VT1 is a high threshold, VT2 is a low threshold, VT3 is a low threshold and VT4 is a high threshold; for a signed bit of +1, VT1 is a low threshold, VT2 is a high threshold, VT3 is a high threshold and VT4 is a low threshold; for a signed bit of 0, VT1 is a high threshold, VT2 is a high threshold, VT3 is a high threshold and VT4 is a high threshold.

A method for multiplying a signed input bit by a signed coefficient bit in a memory array including word lines and bit lines is described. The method includes writing respective threshold levels VT1, VT2, VT3 and VT4 in first, second, third and fourth memory cells to represent the signed coefficient bit, as described above, and applying respective word line voltages $V_{WL0}$, $V_{WL1}$ to the first and second word lines to represent the signed input bit, including when the signed input bit is −1, $V_{WL0}$ is low and $V_{WL1}$ is high; when the signed input bit is +1, $V_{WL0}$ is high and $V_{WL1}$ is low; and when the signed input bit is 0, $V_{WL0}$ is low and $V_{WL1}$ is low. Also, the method includes sensing a difference in respective currents $I_{BL0}$ and $I_{BL1}$ on the first and second bit lines.

Other aspects and advantages of the technology can be seen on review of the drawings, the detailed description and the claims, which follow.

DETAILED DESCRIPTION

Figure 1:
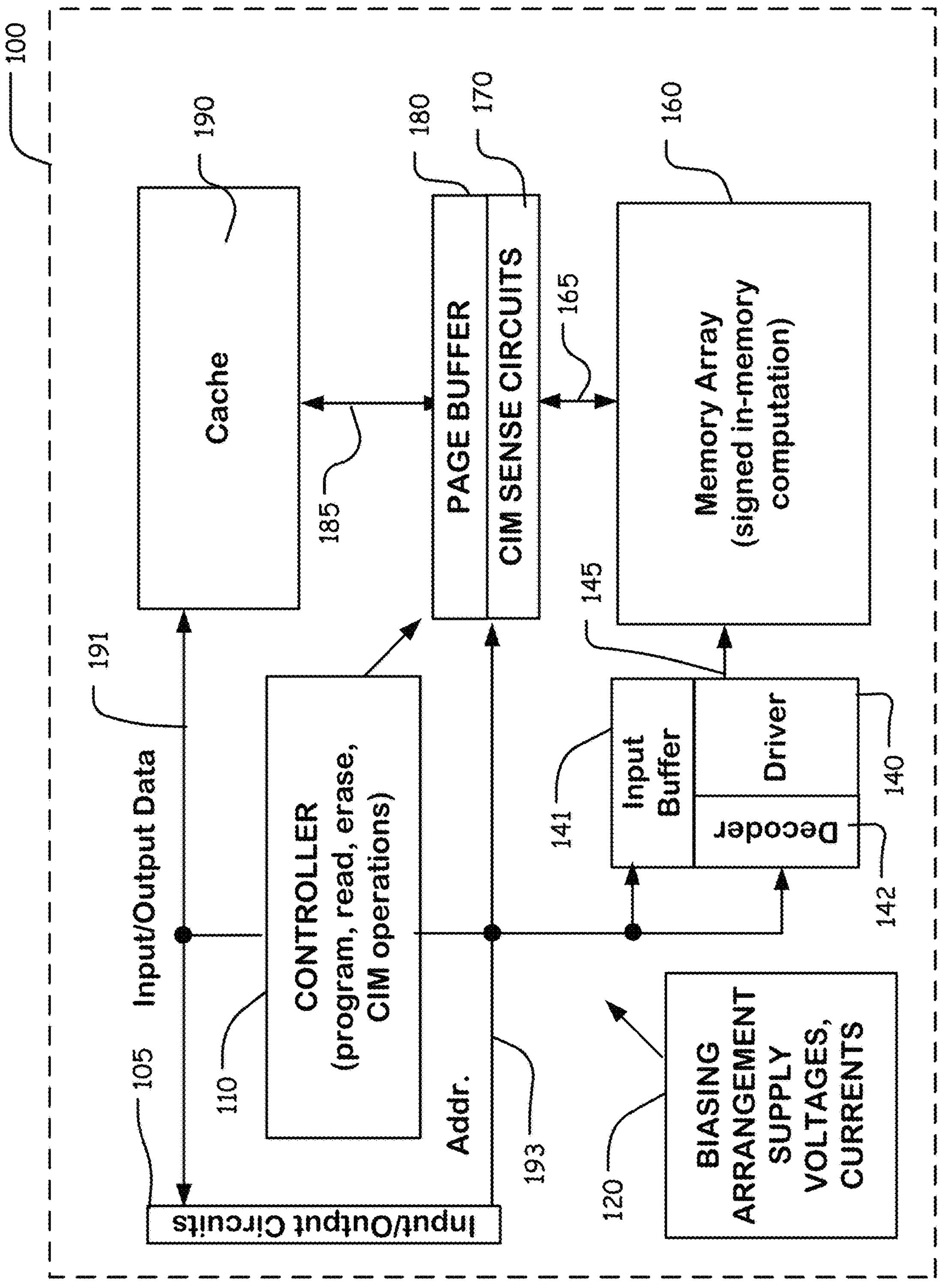
FIG. 1 is a simplified block diagram of an integrated circuit device including a memory array arranged for in-memory computation with signed inputs and weights.

FIG. 1 is a simplified block diagram of an integrated circuit device 100 including a memory array 160 arranged for signed, in-memory computation for a CIM operation, such as a signed, sum-of-products operation. The integrated circuit device 100 can be implemented on a single chip, or on a multichip module.

The device 100 includes input/output circuits 105 for communication of control signals, data, addresses and commands with other data processing resources, such as a CPU or memory controller.

Input/output data is applied on bus 191 to a controller 110, and to cache 190. Also, addresses are applied on bus 193 to a decoder 142, and to the controller 110. Also, the bus 191 and bus 193 can be operably connected to data sources internal to the integrated circuit device 100, such as a general purpose processor or special purpose application circuitry, or a combination of modules providing for example, system-on-a-chip functionality.

The memory array 160 can include an array of memory cells in a NOR architecture or in an AND architecture, such that memory cells are arranged in columns along bit lines and in rows along word lines, and the memory cells in a given column are connected in parallel between a bit line and a source reference. The source reference can comprise a ground terminal or a source line connected to source side biasing resources. The memory cells can comprise charge trapping transistors cells, arranged in a 3D structure.

The bit lines can be connected by block select circuits to global bit lines 165, configured for selectable connection to a page buffer 180, and to CIM sense circuits 170.

The page buffer 180 in the illustrated embodiment is connected by bus 185 to the cache 190. The page buffer 180 includes storage elements and sensing circuits for memory operations, including read and write operations. For flash memory including dielectric charge trapping memory and floating gate charge trapping memory, write operations include program and erase operations.

A driver circuit 140 is coupled to word lines 145 in the array 160, and applies word line voltages to selected word lines in response to a decoder 142 which decodes addresses on line 193, or in a computation operation, in response to input data stored in input buffer 141.

The controller 110 is coupled to the cache 190 and the memory array 160, and to other peripheral circuits used in memory access and in memory computation operations.

Controller 110, using a for example a state machine, controls the application of supply voltages and currents generated or provided through the voltage supply or current sources in block 120, for memory operations and for CIM operations.

The controller 110 includes control and status registers, and control logic which can be implemented using special-purpose logic circuitry including state machines and combinational logic as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The array 160 includes memory cells arranged in columns and rows, where memory cells in columns are connected to corresponding bit lines, and memory cells in rows are connected to corresponding word lines. The array 160 is programmable to store signed coefficients (weights Wi) in sets of memory cells. An example of a set of memory cells storing a signed weight is described with reference to FIG. 3. The sets of memory cells for a vector of signed bits can be operatively coupled with a corresponding pair of bit lines and a plurality of corresponding pairs of word lines, as described with reference to FIG. 4.

In a CIM mode, the word line driver circuit 140 includes drivers configured to drive signed inputs Xi by a select mode of voltages on selected word lines and unselected word lines from the input buffer 141. The CIM sense circuits 170 are configured to sense differences between first and second currents on respective bit lines in selected pairs of bit lines and to produce outputs for the selected pairs of bit lines as a function of the difference. The outputs can be applied to storage elements in the page buffer 180 and to the cache 190.

An implementation of a memory array can be based on charge trapping memory cells, such as floating gate memory cells which can include polysilicon charge trapping layers, or dielectric charge trapping memory cells which can include silicon nitride charge trapping layers. Other types of memory technology can be applied in various embodiments of the technology described herein.

Figure 2A:
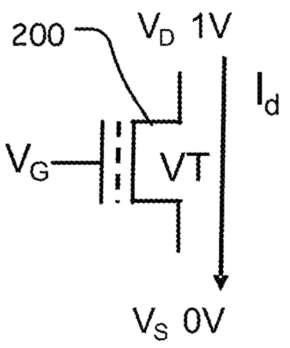
FIG. 2A is a schematic diagram of a charge trapping transistor usable as a memory cell.

FIG. 2A schematically illustrates a charge trapping memory cell based on a memory transistor 200 having a charge trapping layer, a drain, a gate and a source. In operation, a drain voltage VD and a source voltage Vs are applied to the drain and source, respectively. Also, a gate voltage VG is applied to the gate. Charge stored in the charge trapping layer sets a threshold voltage VT for the memory transistor 200.

Figure 2B:
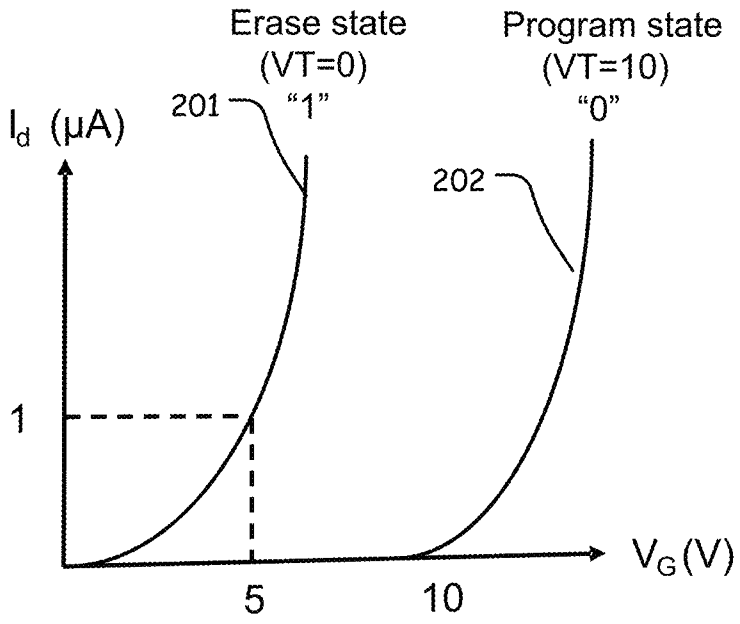
FIG. 2B is a current versus voltage I-V graph showing characteristics of a transistor like that of FIG. 2A.

An example of read performance for a memory transistor 200, like that of FIG. 2A, is illustrated in the graph of FIG. 2B. The graph plots drain current ID versus gate voltage VG for the transistor in high and low threshold states, known as I-V curves. Trace 201 is the I-V curve for a transistor having an erased state, low threshold voltage (e.g. VT=0) which can represent a digital “1”. Trace 202 is the I-V curve for a transistor having a programmed state, high threshold voltage (e.g. VT=10) which can represent a digital “0”. In this example, for an erased state, low threshold memory transistor, a gate voltage VG of 5 V yields 1 μA of drain current. For a programmed state, high threshold memory transistor, a gate voltage VG of 5 V yields 0 μA of current. Of course, the values of 10V, 5V and 0V, and the current values, are used for the purposes of description. Values in actual implementations may vary.

Figure 3:
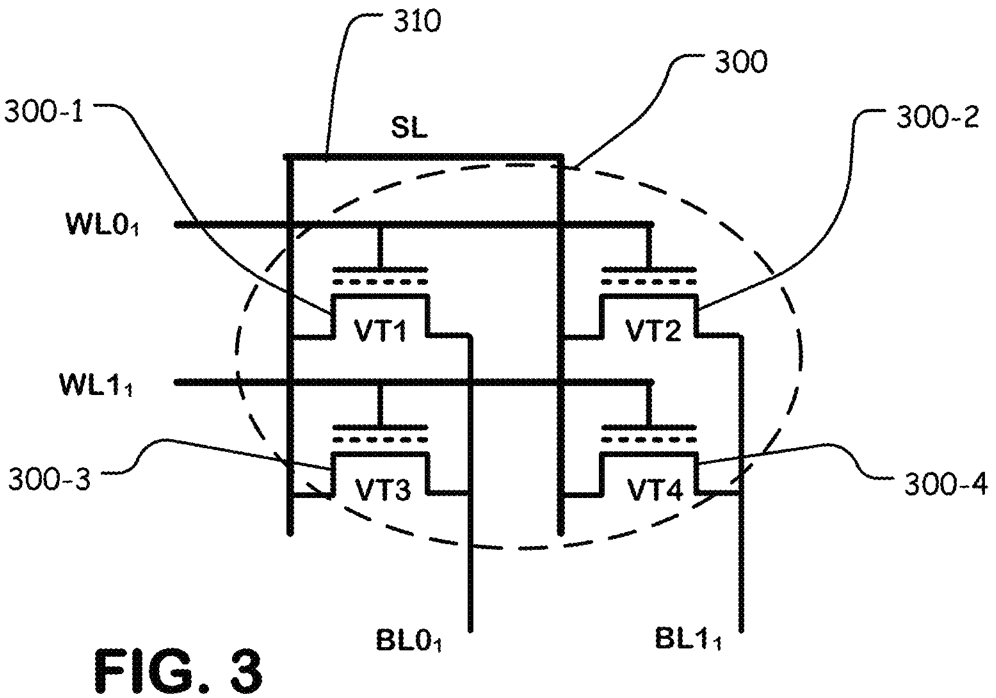
FIG. 3 is a schematic diagram of a set of memory cells arranged for storing a signed coefficient for a CIM operation.

Sets of memory cells with a behavior like that of FIGS. 2A, 2B can be configured as shown in FIG. 3 to represent signed bits having values −1, +1 and 0.

FIG. 3 represents a set of memory cells, implemented in this example by charge trapping memory transistors, configured to store a signed bit. The set of memory cells in FIG. 3 can be one of many sets of memory cells used to store many signed bits in a memory array having a plurality of word lines and a plurality of bit lines. For example, many sets of memory cells like that of FIG. 3 can be used to store a vector of M coefficients Wi (or weights), for i from 1 to M, applied in a sum-of-products operation, or many arrays of coefficients for efficient CIM operations.

The set of memory cells 300 in FIG. 3 includes first, second, third and fourth memory cells 300-1 to 300-4, each implemented by a charge trapping memory transistor. For the purposes of notation, we refer to the set of memory cells 300 as storing a signed bit for a coefficient $W_1$ in a vector Wi. The first memory cell 300-1 is on a first bit line $BL0_1$ and a first word line $WL0_1$. The second memory cell 300-2 is on a second bit line $BL1_1$ and the first word line $WL0_1$. The third memory cell 300-3 is on the first bit line $BL0_1$ and a second word line $WL1_1$. The fourth memory cell 300-4 is on the second bit line $BL1_1$ and the second word line $WL1_1$. The source sides of the first, second, third and fourth memory cells 300-1 to 300-4 are connected to a source reference circuit, which can comprise a ground terminal or a source line connected to source side biasing resources operable for memory operations such as program and erase. In the illustrated example, the source reference circuit includes a common source line 310 connected to source side biasing circuits (not shown).

To store a signed bit in the set of memory cells 300, respective threshold levels VT1, VT2, VT3 and VT4 in are written in the first, second, third and fourth memory cells 300-1 to 300-4.

In this embodiment, when the signed coefficient bit is −1, VT1 is a high threshold, VT2 is a low threshold, VT3 is a low threshold and VT4 is a high threshold. When the signed coefficient bit is +1, VT1 is a low threshold, VT2 is a high threshold, VT3 is a high threshold and VT4 is a low threshold. When the signed coefficient bit is 0, VT1 is a high threshold, VT2 is a high threshold, VT3 is a high threshold and VT4 is a high threshold. The terms "low" and "high" are used in this context to refer to values below and above, respectively, a read voltage by amounts suitable for operations as described herein.

Table 1 illustrates the example threshold states for the set of memory cells 300 using the values described with reference to FIG. 2A.

TABLE 1

| weight (W) | 1 | 0 | −1 |
|---|---|---|---|
| VT1, VT2, VT3, VT4 | 0, 10, 10, 0 V | 10, 10, 10, 10 V | 10, 0, 0, 10 V |

To execute a multiply operation, respective word line voltages $V_{WL0}$, $V_{WL1}$ are applied to the first and second word lines to represent the signed input bit Xi.

In this embodiment, when the signed input bit is −1, $V_{WL0}$ is low and $V_{WL1}$ is high. When the signed input bit is +1, $V_{WL0}$ is high and $V_{WL1}$ is low. When the signed input bit is 0, $V_{WL0}$ is low and $V_{WL1}$ is low. The terms "low" and "high" are used in this context to refer to values below and above, respectively, a level to turn on an erase state transistor by amounts suitable for operations as described herein.

Table 2 illustrates example word line voltages applied for signed input values Xi.

TABLE 2

| input (Xi) | +1 | 0 | −1 |
|---|---|---|---|
| $V_{WL0}$, $V_{WL1}$ | 5, 0 V | 0, 0 V | 0, 5 V |

When the word line voltages are applied, currents $I_{BL0}$ and $I_{BL1}$ are induced on the first and second bit lines. Sensing a difference in respective currents $I_{BL0}$ and $I_{BL1}$ on the first and second bit lines can yield a result representing a product P=(Xi)×(Wi), an example of which is shown in Table 3.

TABLE 3

| $I_{BL0} - I_{BL1}$ | W = +1 | W = 0 | W = −1 |
|---|---|---|---|
| input(Xi) = 1 | 1 μA | 0 | −1 μA |
| input(Xi) = 0 | 0 | 0 | 0 |
| input(Xi) = −1 | −1 μA | 0 | 1 μA |

In order to multiply a signed input vector Xi[0:M] by a signed weight vector Wi[1:N], a plurality of sets of memory cells like that of FIG. 3 can be used, one for each bit of the signed weight vector. The plurality of sets of memory cells can be arranged as illustrated in FIG. 4.

Figure 4:
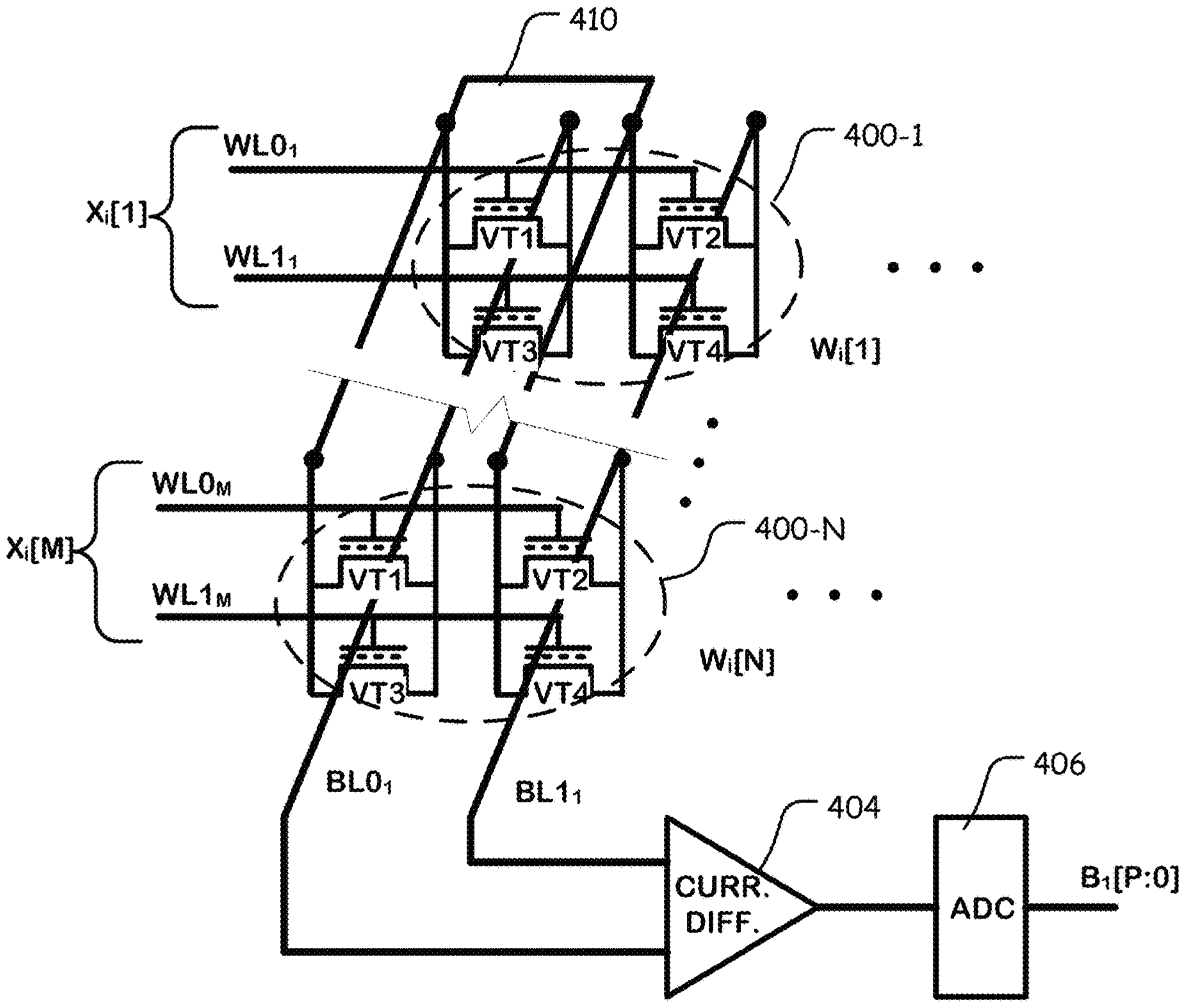
FIG. 4 is a schematic diagram of a plurality of sets of memory cells in a memory array, with sensing circuits for a sum-of-products CIM operation with signed inputs and signed weights.

In FIG. 4, a number N of sets of memory cells 400-1 to 400-N are arrayed along a pair of bit lines $BL0_1$ and $BL1_1$ and source line 410. Each of the sets 400-1 to 400-N stores a corresponding signed bit of a weight vector Wi[1:N], by the magnitudes of the written threshold voltages VT1 to VT4, as shown. The number N of sets of memory cells 400-1 to 400-N are arrayed along respective pairs of word lines $WL0_1$, $WL1_1$ to $WL0_M$, $WL1_M$, to receive signed bits of an input vector Xi[1:M]. The word lines $WL0_1$ to $WL0_M$ can be connected in common to the same signal. Likewise, word lines $WL1_1$ to $WL1_M$ can be connected in common to the same signal.

The pair of bit lines $BL0_1$ and $BL1_1$ is connected to sensing circuits that can include a circuit 404 and an analog-to-digital converter 406. The circuit 404 can generate a difference in the first and second currents $I_{BL0}$ and $I_{BL1}$, the output of which is applied to the analog-to-digital converter 406. The output of the analog-to-digital converter 406 is a signed sum of products $B_1$ [P:0], where the bit $B_1$[P] can be a sign bit.

Depending on the stored bits and the input bits, the current on the bit lines and the difference in currents on the two bit lines can be represented as shown in Table 4.

TABLE 4

| $I_{BL0}$, $I_{BL1}$ (μA) | $I_{BL0} - I_{BL1}$ (μA) |
|---|---|
| 0, 1, . . . , N − 1, N | −N, −N + 1, . . . , N − 1, N |

The difference in the currents $I_{BL0}$ and $I_{BL1}$ from each cell represents an inner product of the sum of products:

$$f(X_x) = \sum_{x=1}^{N} W_x \times X_x$$

The combination of currents from all the cells 400-1 to 400-N represents the sum of the inner products.

Figure 5:
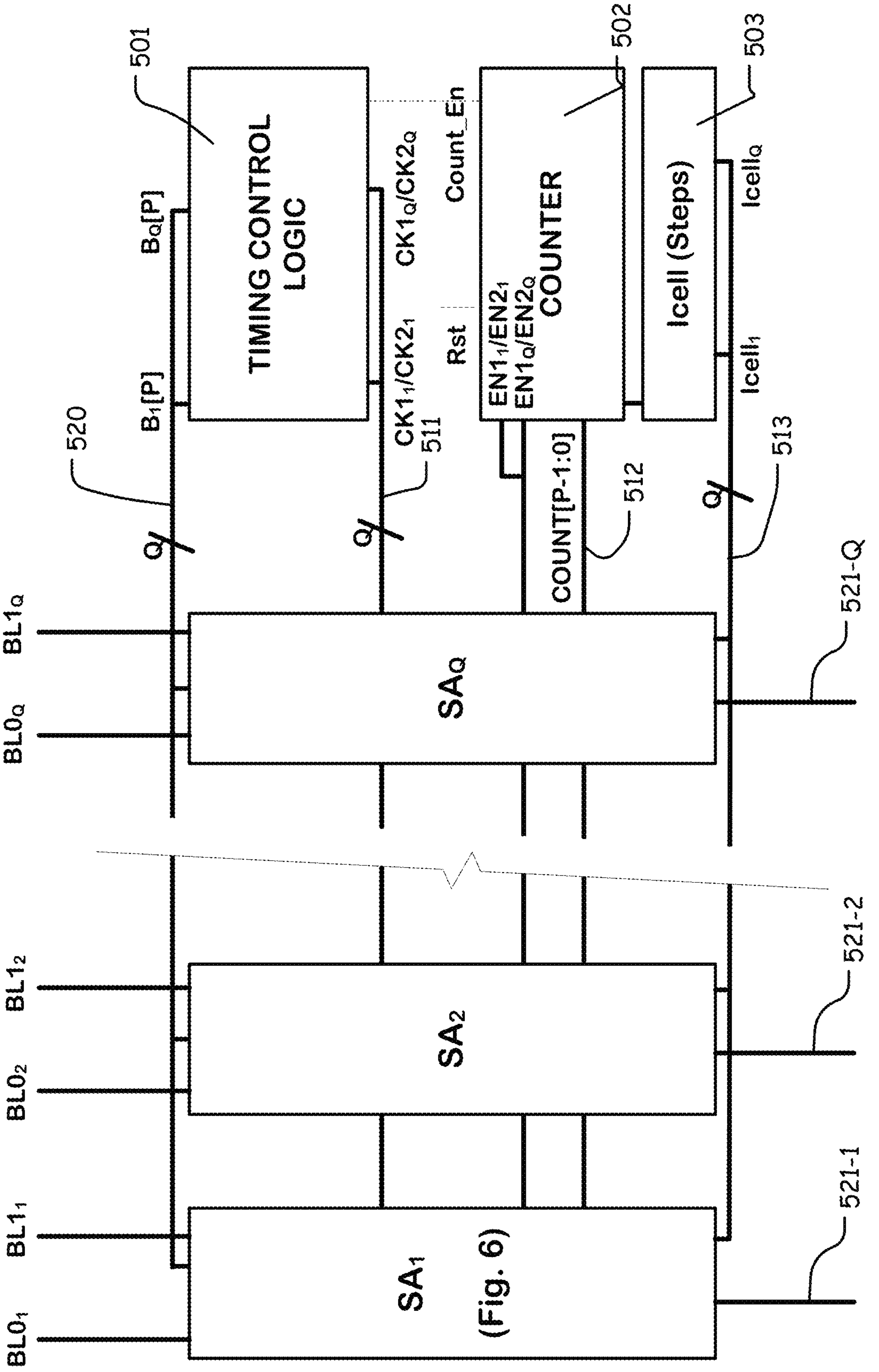
FIG. 5 is a block diagram of sensing circuit modules and control logic suitable for an array like that of FIG. 1.

Sensing circuits and control logic for CIM operations is illustrated in FIG. 5, for a memory array including a large number of bit lines and can include a plurality of pairs of bit lines. In the illustration, each bit line pair $BL0_i$ and $BL1_i$, (i=1 to Q) in the plurality of pairs of bit lines is coupled to corresponding sense circuitry modules SAI to SAQ. In FIG. 5, If P=2, then it produces 3 bits output, and the counter output is 2 bits: COUNT [1:0]. For an embodiment with 4 bits output, P=3 and the counter output is P−1 equal 3 bits: COUNT [2:0].

Figure 6:
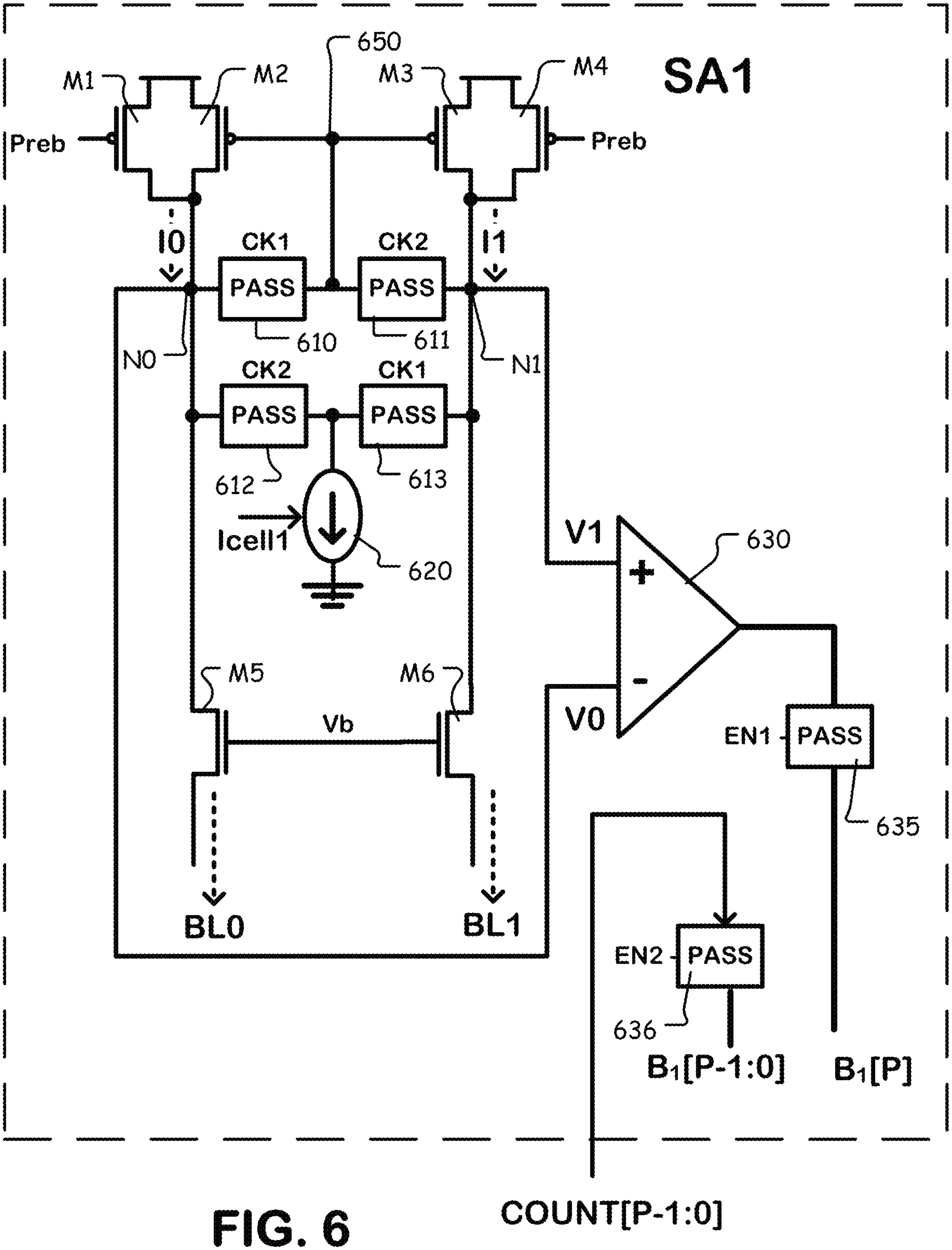
FIG. 6 is a schematic diagram of a sensing circuit module usable in the circuit of FIG. 5.

The sensing circuits can be implemented as illustrated in FIG. 6. The control circuits provide logic in this example including timing control logic 501, a counter 502, and an adjustable reference current circuit 503. Of course, other types of sensing circuitry may use other configurations of control logic.

Specifically, for example, the sensing circuits (e.g. the circuit 404, and the analog-to-digital converter 406) can be implemented as shown in FIG. 6. Control logic (501, 502, 503) includes modules suitable for use with the sensing circuits of FIG. 6. Thus, the timing control logic 501 receives a sign bit output $B_1[P]$ to $B_Q[P]$ on bus 520 from each of the corresponding sense circuitry modules $SA_1$ to $SA_Q$ Timing control logic 501 produces control signals CK1 and CK2 on bus 511 for each of the sense circuitry modules $SA_1$ to $SA_Q$. The sequence of the control signals CK1 and CK2 for each of the sense circuitry modules depends on the sign bits for sensing circuits like that of FIG. 6.

The counter 502 receives an enable signal from the timing control logic 501, and a reset input from other control circuits on the device. In this example, the counter is a two bit counter generating output COUNT[1:0] on bus 512 which is applied to a reference current circuit 503, and each of the sense circuitry modules $SA_1$ to $SA_Q$. The reference current circuit 503 produces a Icell control signal on bus 513 to set the reference current Icell for each of the sense circuitry modules $SA_1$ to $SA_Q$. The signed outputs $B_1[2:0]$ to $B_Q[2:0]$ of the sense circuitry modules $SA_1$ to $SA_Q$ are applied on lines 521-1 through 521-Q to storage elements in a page buffer (e.g. page buffer 180 of FIG. 1) or other available storage on the device. Thus, the circuit can be configured to perform a CIM operation including a plurality of sum-of-products operations in parallel.

FIG. 6 is a schematic diagram of a sense circuitry module $SA_1$, using a current injection circuit. The module is operably connectable (e.g. by column select circuits) to a pair of bit lines BL0 and BL1, and includes a current mirror circuit comprising transistors M1 to M6. Transistors M5 and M6 (NMOS) are series connected from nodes N0 and N1 for current flow with bit lines BL0 and BL1, respectively, and have their gates connected to a common bias Vb, produced by bias circuitry (not shown) that can generate a bias voltage Vb of about 1V+Vth, where Vth is the threshold voltage of the transistors M5 and M6. Transistors M1 and M2 (PMOS) are connected in parallel between node N0 and a supply node (e.g. VDD). Transistors M3 and M4 (PMOS) are connected in parallel between node N1 and a supply node (e.g. VDD). The gates of transistors M2 and M3 are connected to node 650. The gates of transistors M1 and M4 are connected to a precharge control signal Preb. A first pass gate 610 responsive to the control signal CK1 is connected between node N0 and node 650. A second pass gate 611 responsive to the control signal CK2 connected between node N1 and node 650. A third pass gate 612 is connected between node N0 and a reference current generator 620. A fourth pass gate 613 is connected between node N1 and the reference current generator 620. The reference current generator 620 is responsive to the Icell1 control signal from the control logic as discussed above, to produce selected reference currents for current injection to adjust the current on the BL0 and BL1 sides, and to find the magnitude of the difference in currents on BL0 and BL1.

Voltage V0 at node N0 and voltage V1 at node N1 are applied as negative and positive inputs, respectively, of comparator 630. Output of comparator 630 is applied to a pass-through terminal of pass gate 635, having a control terminal EN1 receiving a signal from the counter or control logic. For example, the output of comparator 630 is applied to a control logic 501. When the comparator flips in a given sense circuitry module, then the corresponding enable signals ($EN1_1/EN2_1$ to $EN1_Q$ to $EN2_Q$) are asserted for the corresponding sense module. The pass-through terminal of the pass gate 636 is connected to the output COUNT[P−1:0] (e.g., P=2) of the counter as discussed above. Output of the pass gate 635 is the sign bit $B_1[P]$. The combination of the outputs of pass gate 635 and pass gate 636 is the signed output $B_1[P:0]$ of the sense circuitry module. A two-bit counter is used in this example. Higher resolution counters (e.g. 3 bits or more) can be used with corresponding circuit changes, such as changes in Icell generator step sizes, to sense finer degrees of current differences.

In operation, the current mirror circuit and the control signals CK1 and CK2 are controlled to obtain voltages V1 and V0, in a first step used to determine whether the difference between the current on bit lines BL0 and BL1 is positive or negative to obtain bit $B_1[P]$. In a second step, or a sequence of steps, the current mirror circuit, the control signals and the Icell generator are used to determine the magnitude of the difference in currents to obtain bits $B_1[P-1:0]$.

In operation, V0 will decrease as the current on BL0 increases. Likewise, V1 decreases as current on BL1 increases.

In the first step, CK1 and CK2 are set so one of nodes N0 and N1 is connected to node 650 to establish a primary current leg for the current mirror circuit. In this first step, if V1 is greater than V0 (current on BL1 is lower) the output of the comparator 630 sets $B_1[P]$ to "1", and the sign is positive. If V1 is less than V0 (current on BL1 is higher) the output of the comparator 630 sets $B_1[P]$ to "0", and the sign is negative.

In the next steps (the number of steps depends on the size of the counter), the magnitude of the current difference is determined. The setting of the control signals CK1 and CK2 depends on the sign.

More generally, the control circuits are configured to execute a method including sensing a difference in respective currents $I_{BL0}$ and $I_{BL1}$ on the first and second bit lines, including determining a sign of the difference by comparing one of currents $I_{BL0}$ and $I_{BL1}$ to a reference current, and determining a magnitude of the difference including selecting one of currents $I_{BL0}$ and $I_{BL1}$ in dependence on the sign and comparing the selected one of the currents to a sequence of reference currents.

Figure 7:
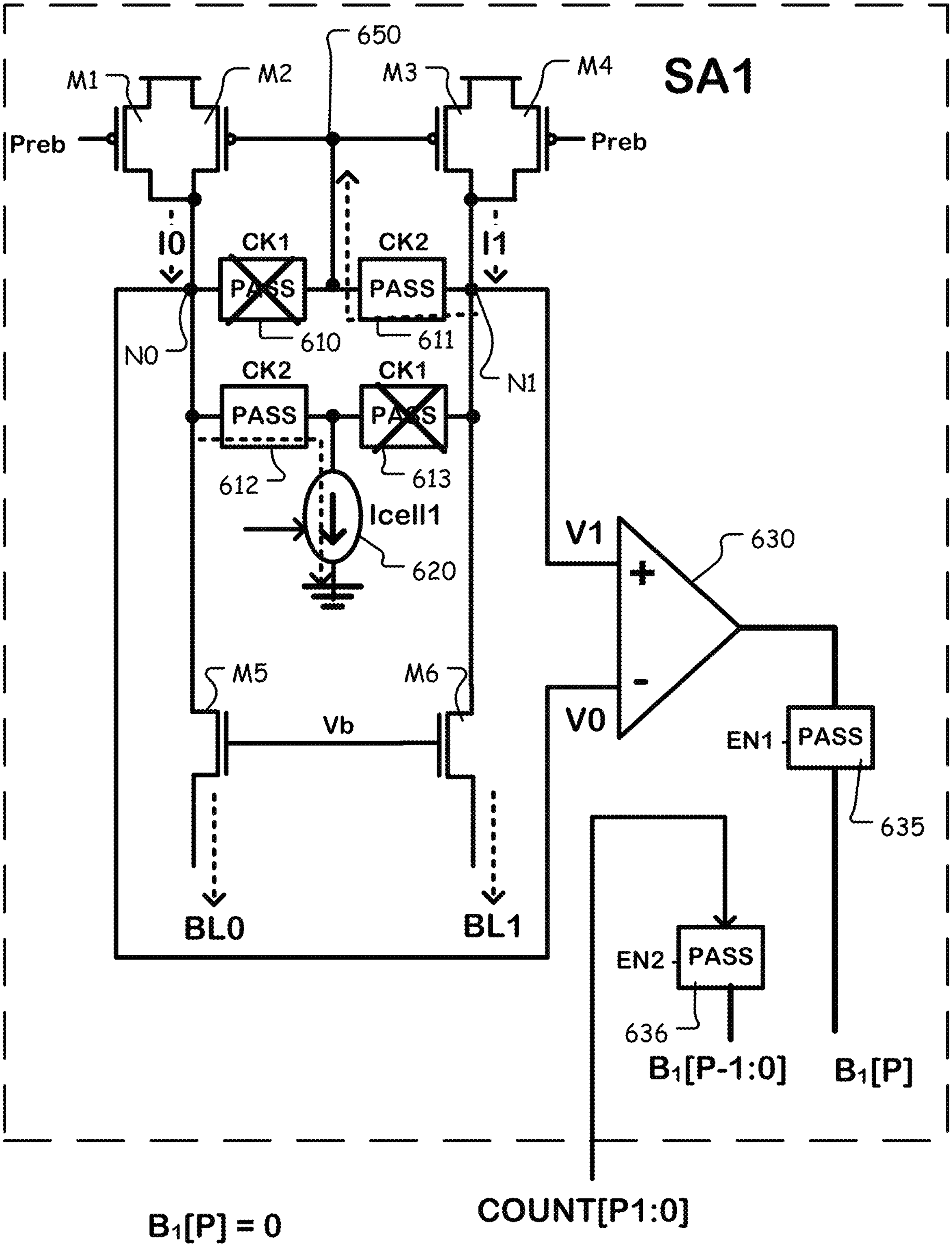
FIG. 7 is the schematic diagram of FIG. 6, illustrating operations with one state of the control signals CK1/CK2.

FIG. 7 illustrates the setting for $B_1[P]=0$. In this condition, current on BL1 is greater than current on BL0. Thus, CK2 is on and node N1 is connected to node 650. Node N0 is connected to the reference current generator 620. The current Icell adjusts current to I0 on the BL0 side, but BL0 remains the same current, and corresponding decrease in voltage V0. The control logic steps the current Icell in sequence in response to the output of the counter COUNT [P−1:0] until V0 is less than V1 and the output of the comparator 630 flips, which enables the pass gate 636 to pass the output of the counter as the sense circuitry module output bits $B_1[P-1:0]$, which combined with the sign bit provides the output $B_1[P:0]$.

Figure 8:
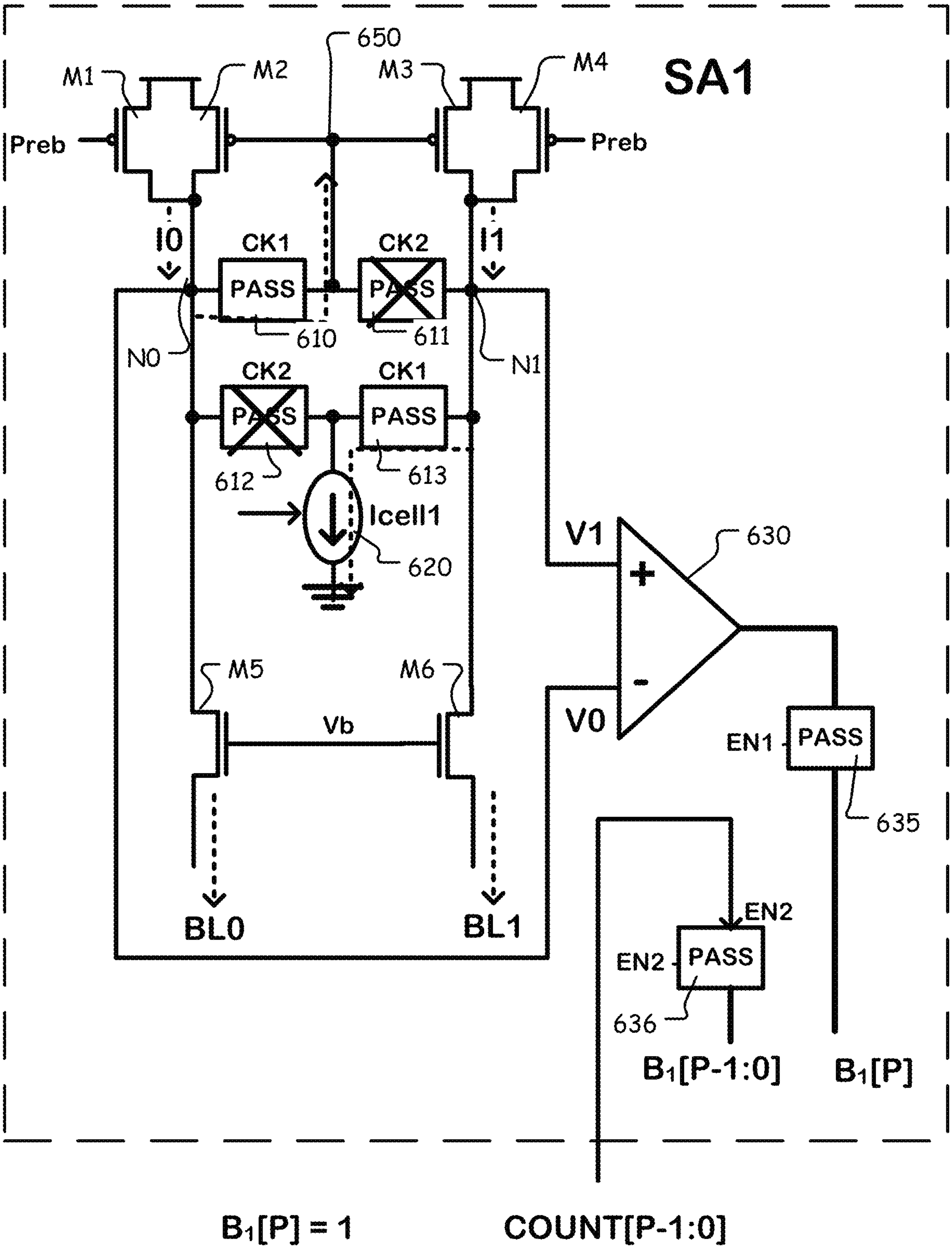
FIG. 8 is the schematic diagram of FIG. 6, illustrating operations with another state of the control signals CK1/CK2.

FIG. 8 illustrates the setting for $B_1[P]=1$. In this condition, node N0 is connected to node 650. Node N1 is connected to the reference current generator 620. The current Icell causes an increase in the current I1, and corresponding decrease in voltage V1. The control logic steps the current Icell in sequence in response to the output of the counter COUNT [P−1:0] until the output of the comparator 630 flips, which enables the pass gate 636 to pass the output of the counter as the sense circuitry module outputs bits $B_1[P-1:0]$, which combined with the sign bit provides the output $B_1[P:0]$.

Table 5 illustrates representative outputs for sense circuitry module "i" for a case in which P=2.

TABLE 5

| BL0-BL1 | −3 | −2 | −1 | 0 | 1 | 2 | 3 |
|---|---|---|---|---|---|---|---|
| $B_i[2:0]$ | 011 | 010 | 001 | 000 | 101 | 110 | 111 |

A sequence of operations can include the following for a condition in which the current on the first bit line BL0 is about 0 μA, and the current on the second bit line BL1 is about 3 μA:

1) precharge V0 and V1 and reset the counter.
2) determine sign bit, setting CK1 and CK2 so that node N1 is connected to the node 650. In this case, because current on BL1 is greater than current on BL0, voltage V1 is less than voltage V0 and the sign is "0". EN1 is on, setting $B_1[P]$ to 0.
3) precharge V0 and V1.
4) set CK1 and CK2 in response to $B_1[P]$ to adjust current I0 (Icell+$I_{BL0}$) at node N0, by setting CK1 off and CK2 on. Set Icell to 0.5 μA, while COUNT[P−1:0] is 00. Comparator is still 0.
5) set Icell to 1.5 μA while COUNT is 01. Comparator still 0.
6) set cell to 2.5 μA while count is 10. Comparator still 0.
7) set Icell to 3.5 μA, while count is 11. Comparator flips to 1, which as the trigger signal, enables passing the counter outputs as the output bits $B_1[P-1:0]$ and the output $B_1[P:0]$ is 011.

A sequence of operations can include the following for a condition in which the current on the first bit line BL0 is about 3 HA, and the current on the second bit line BL1 is about 0 μA:

1) precharge V0 and V1 and reset the counter.
2) determine sign bit, setting CK1 and CK2 so that node N0 is connected to the node 650. In this case, because current on BL1 is less than current on BL0, voltage V1 is greater than voltage V0 and the sign is "1". EN1 is on, setting $B_1[P]$ to 1.
3) precharge V0 and V1.
4) set CK1 and CK2 in response to $B_1[P]$ to adjust current I1 (Icell+$I_{BL1}$) at node N1, by setting CK1 on and CK2 off. Set Icell to 0.5 μA, while COUNT[P−1:0] is 00. Comparator is still 1.
5) set Icell to 1.5 μA while COUNT is 01. Comparator still 1.
6) set Icell to 2.5 μA while count is 10. Comparator still 1.
7) set Icell to 3.5 μA, while count is 11. Comparator flips to 0, which as the trigger signal, enables passing the counter outputs as the output bits $B_1[P-1:0]$ and the output $B_1[P:0]$ is 111

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

A number of flowcharts illustrating logic executed by a memory controller or by a memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Embodiments illustrated in FIGS. 3 and 4 are based on NOR or AND architecture flash arrays. Other embodiments could be based on NAND architecture flash arrays. For NAND architectures, modifications of modules, such as circuit 404 of FIG. 4, and comparator 630 of FIG. 6 to FIG. 8, may be necessary.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit, comprising:

an array of memory cells including a plurality of bit lines and word lines;

word line drivers configured to drive voltages on respective word lines; and sensing circuits configured to sense differences between first and second currents on respective bit lines in selected pairs of bit lines and to produce outputs for the selected pairs of bit lines as a function of the differences, wherein the array of memory cells is programmable to store signed weights in sets of memory cells, each set of memory cells of the sets of memory cells being operatively coupled with a corresponding pair of bit lines and a corresponding pair of word lines, and wherein, during an in-memory computation process of the circuit, the word line drivers are configured to drive voltages, on a selected pair of word lines, representing a signed input on the selected pair of word lines.

2. The circuit of claim 1, wherein the output for each selected pair of bit lines represents a sum of products of signed inputs on selected pairs of word lines and the signed weights stored in a plurality of sets of memory cells of the sets of memory cells on the selected pair of bit lines.

3. The circuit of claim 1, wherein the first and second currents on a particular pair of bit lines in the selected pairs of bit lines are responsive to signed inputs on selected pairs of word lines and the signed weights stored in a plurality of sets of memory cells of the sets of memory cells on the particular pair of bit lines.

4. The circuit of claim 1, wherein a set of memory cells in the sets of memory cells includes first and second memory cells connected to a first word line in a corresponding pair of word lines, and third and fourth memory cells connected to a second word line in the corresponding pair of word lines, the first and third memory cells being on a first bit line in a corresponding pair of bit lines and the second and fourth memory cell being on a second bit line in the corresponding pair of bit lines.

5. The circuit of claim 1, wherein a signed weight stored in a set of memory cells in the sets of memory cells is represented by threshold levels VT1, VT2, VT3 and VT4 in first, second, third and fourth memory cells, wherein the first memory cell is on a first bit line and a first word line, the second memory cell is on a second bit line and the first word line, the third memory cell is on the first bit line and a second word line, and the fourth memory cell is on the second bit line and the second word line, and wherein:

for a signed bit of −1, VT1 is a high threshold, VT2 is a low threshold, VT3 is a low threshold and VT4 is a high threshold;

for a signed bit of +1, VT1 is a low threshold, VT2 is a high threshold, VT3 is a high threshold and VT4 is a low threshold; and for a signed bit of 0, VT1 is a high threshold, VT2 is a high threshold, VT3 is a high threshold and VT4 is a high threshold.

6. The circuit of claim 1, wherein the sensing circuits include a circuit to generate a difference between the first and second currents and an analog-to-digital converter.

7. The circuit of claim 1, wherein the sensing circuits are configured to execute a procedure including sensing a sign, and sensing a magnitude of the difference.

8. The circuit of claim 1, wherein the sensing circuits are configured to execute a procedure including comparing the first and second currents to generate a sign bit, and converting a difference between the first and second currents to generate one or more bits indicating a magnitude.

9. The circuit of claim 1, wherein the sensing circuits include a sensing module connectable to a pair of bit lines, the sensing module including a current mirror circuit having a first leg and a second leg operatively connectable to first and second bit lines in the pair of bit lines, and an adjustable reference current source, and responsive to control signals to set a first configuration to adjust current on the first leg using the adjustable reference current source, and to set a second configuration to adjust current on the second leg using the adjustable reference current source, and including a comparator to compare a voltage on the first leg to a voltage on the second leg.

10. The circuit of claim 1, wherein the array of memory cells is a NOR or AND architecture flash memory array.

11. The circuit of claim 1, wherein the memory cells in the array of memory cells are charge trapping memory cells.

12. The circuit of claim 1, wherein the sensing circuits include a sensing module connectable to a pair of bit lines, the sensing module including a current mirror circuit having a first leg and a second leg operatively connectable to first and second bit lines in the pair of bit lines, and an adjustable reference current source, and responsive to control signals to set a first configuration to adjust current on the first leg using the adjustable reference current source, and to set a second configuration to adjust current on the second leg using the adjustable reference current source, and including a comparator to compare a voltage on the first leg to a voltage on the second leg, and wherein the sensing circuits include a control circuit providing the control signals, including logic to provide control signals to set an initial one of the first and second configurations, and store an output of the comparator in the initial configuration as a sign bit of the difference, and to provide control signals to set a selected one of the first and second configurations in dependence on the sign bit and to execute a sequence of steps in the selected configuration including adjusting the adjustable reference current source to determine a magnitude of the difference.

13. The circuit of claim 12, wherein the current mirror circuit is configured as a current injection circuit.

14. The circuit of claim 12, wherein the control circuit includes a counter to count steps in the sequence of steps, and circuits to apply an output of the counter as the magnitude of the difference for the sensing module in response to the output of the comparator.

15. The circuit of claim 12, wherein the sensing circuits include a plurality of sensing modules, including said first mentioned sensing module, connectable to a plurality of pairs of bit lines.

16. The circuit of claim 12, wherein the first and second currents on the pair of bit lines are responsive to signed inputs on selected pairs of word lines and signed weights stored in a plurality of sets of memory cells of the sets of memory cells on the pair of bit lines.

17. The circuit of claim 12, wherein the signed weights are stored in respective sets of memory cells, each set including first, second, third and fourth memory cells with a signed weight represented by threshold levels VT1, VT2, VT3 and VT4, wherein the first memory cell is on a first bit line and a first word line, the second memory cell is on a second bit line and the first word line, the third memory cell is on the first bit line and a second word line, and the fourth memory cell is on the second bit line and the second word line, and wherein:

for a signed bit of −1, [VT1] VT1 is a high threshold, VT2 is a low threshold, VT3 is a low threshold and VT4 is a high threshold, for a signed bit of +1, [VT1] VT1 is a low threshold, VT2 is a high threshold, VT3 is a high threshold and VT4 is a low threshold, and for a signed bit of 0, VT1 is a high threshold, VT2 is a high threshold, VT3 is a high threshold and VT4 is a high threshold.

18. A method for multiplying a signed input bit by a signed coefficient bit in a memory array including word lines and bit lines, including:

storing respective threshold levels VT1, VT2, VT3 and VT4 in first, second, third and fourth memory cells to represent the signed coefficient bit, wherein the first memory cell is on a first bit line and a first word line, the second memory cell is on a second bit line and the first word line, the third memory cell is on the first bit line and a second word line, and the fourth memory cell is on the second bit line and the second word line;

applying, during an in-memory computation process, respective word line voltages $V_{WL0}$, $V_{WL1}$ to the first and second word lines to represent the signed input bit; and sensing a difference in respective currents $I_{BL0}$ and $I_{BL1}$ on the first and second bit lines, including determining a sign of the difference by comparing one of currents $I_{BL0}$ and $I_{BL1}$ to a reference current, and determining a magnitude of the difference including selecting one of currents $I_{BL0}$ and $I_{BL1}$ in dependence on the sign and comparing the selected one of the currents to a sequence of reference currents.

19. The method of claim 18, including:

when the signed coefficient bit is −1, VT1 is a high threshold, VT2 is a low threshold, VT3 is a low threshold and VT4 is a high threshold;

when the signed coefficient bit is +1, VT1 is a low threshold, VT2 is a high threshold, VT3 is a high threshold and VT4 is a low threshold; and when the signed coefficient bit is 0, VT1 is a high threshold, VT2 is a high threshold, VT3 is a high threshold and VT4 is a high threshold, wherein the applying of the respective word line voltages $V_{WL0}$, $V_{WL1}$ to the first and second word lines to represent the signed input bit includes:

when the signed input bit is −1, $V_{WL0}$ is low and $V_{WL1}$ is high;

when the signed input bit is +1, $V_{WL0}$ is high and $V_{WL1}$ is low; and when the signed input bit is 0, $V_{WL0}$ is low and $V_{WL1}$ is low.

* * * * *